(12) United States Patent
Kim (10) Patent No.: US 10,841,523 B2
(45) Date of Patent: Nov. 17, 2020

(54) DATA OUTPUT CIRCUIT AND IMAGE SENSOR INCLUDING THE SAME

(71) Applicant: SK hynix Inc., Icheon-si (KR)

(72) Inventor: Tae Gyu Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 1 day.

(21) Appl. No.: 16/401,366

(22) Filed: May 2, 2019

(65) Prior Publication Data
US 2020/0213548 A1 Jul. 2, 2020

(30) Foreign Application Priority Data
Dec. 28, 2018 (KR) .................. 10-2018-0171452

(51) Int. Cl.
| | |
|---|---|
| *H04N 5/369* | (2011.01) |
| *H04N 5/374* | (2011.01) |
| *H01L 27/146* | (2006.01) |
| *G11C 11/00* | (2006.01) |
| *G11C 11/419* | (2006.01) |
| *G11C 11/418* | (2006.01) |
| *H04N 5/378* | (2011.01) |

(52) U.S. Cl.
CPC ........... *H04N 5/378* (2013.01); *G11C 11/419* (2013.01); *H04N 5/3698* (2013.01)

(58) Field of Classification Search
CPC .... H04N 5/378; H04N 5/3698; H04N 5/3745; H04N 5/37455; H04N 5/37457; H04N 5/374; H01L 27/146

USPC .... 348/300, 308, 302, 230.1, 572, 294, 297; 257/291, 292, 225, 300, 390; 250/208.1, 250/584; 341/109, 110, 116, 117, 126, 341/144, 155; 365/185.13, 210.13; 438/262

See application file for complete search history.

(56) References Cited

U.S. PATENT DOCUMENTS

| | | | |
|---|---|---|---|
| 8,432,761 B2 | 4/2013 | Kim et al. | |
| 8,872,938 B2 | 10/2014 | Yoo et al. | |
| 2007/0165441 A1* | 7/2007 | Kurjanowicz | G11C 17/16 365/96 |
| 2007/0222881 A1* | 9/2007 | Mentzer | H04N 3/14 348/308 |
| 2008/0247249 A1* | 10/2008 | Lee | G11C 11/4091 365/205 |
| 2013/0299674 A1* | 11/2013 | Fowler | H01L 27/146 250/214 DC |
| 2016/0028974 A1* | 1/2016 | Guidash | H04N 5/357 348/294 |

(Continued)

*Primary Examiner* — Marly S Camargo
(74) *Attorney, Agent, or Firm* — Perkins Coie LLP (57) ABSTRACT

Disclosed are devices, systems and methods for reading out data at a high speed. The data output circuit includes a line memory configured to latch a digital signal, and output the latched digital signal to a pair of column lines in response to an output control signal, a precharge circuit configured to precharge the pair of column lines with a first precharge voltage level in response to a first precharge signal, a charge circuit configured to charge the pair of column lines with a voltage, a charge controller configured to charge the charge circuit with a second precharge voltage level in response to a second precharge signal, and a sense amplifier configured to amplify an output voltage of the charge circuit in response to a sensing enable signal.

20 Claims, 3 Drawing Sheets

(56) References Cited

U.S. PATENT DOCUMENTS

| | | | |
|---|---|---|---|
| 2016/0163379 A1* | 6/2016 | Roine | G11C 11/419 |
| | | | 365/203 |
| 2018/0220094 A1* | 8/2018 | Yang | H04N 5/378 |
| | | | 348/300 |
| 2018/0376090 A1* | 12/2018 | Liu | H04N 5/378 |
| | | | 348/308 |
| 2020/0099879 A1* | 3/2020 | Kim | H04N 5/37455 |
| | | | 348/241 |
| 2020/0099882 A1* | 3/2020 | Kim | H04N 9/045 |
| | | | 348/308 |

* cited by examiner

FIG.3

DATA OUTPUT CIRCUIT AND IMAGE SENSOR INCLUDING THE SAME

CROSS-REFERENCE TO RELATED APPLICATION

This patent document claims priority based upon Korean patent application No. 10-2018-0171452, filed on Dec. 28, 2018, the disclosure of which is hereby incorporated in its entirety by reference herein.

TECHNICAL FIELD

Embodiments of the present disclosure generally relate to a data output circuit and an image sensor including the same, and more particularly to a technology for reading out data at a high speed.

BACKGROUND

The complementary metal oxide semiconductor (CMOS) technology has been adopted to design and fabricate sensors in the field of imaging where the charge coupled device (CCD) dominated most of image sensing devices in the past decades. A CMOS image sensor (CIS) has traditionally had lower image quality compared to the CCD. A CMOS image sensor (CIS) to has traditionally had lower image quality compared to the CCD. However, the CIS is rapidly reaching parity with the CCD in image quality and is expanding rapidly into the image sensor market thanks to their low power consumption, low price, and small size. Notably, the CIS allows video cameras to record at high quality and high frame rate and is now also expanding into the video camera market.

The CIS includes, among others, an analog-to-digital converter (ADC) to convert analog signals (pixel signals) generated from a pixel array into digital signals.

The correlated double sampling can improve the signal to noise ratio by subtracting a reference output signal from the actual signal of the pixel. The ADC performs the analog-to-digital conversion using the resultant signal of the correlated double sampling. After performing the correlated double sampling on an analog output voltage generated by the image sensor pixel array, the resultant voltage is converted into a digital signal and stored in a memory space. A sense amplifier may sense and amplify the digital signal readout from the memory through a column line to generate an amplified digital signal.

However, the number of column lines may increase in proportion to increasing resolution. As a result, the increase in data loading of the column lines may lead to a decrease in readout speed. If a gain of the sense amplifier increases to read out data at a higher speed, current consumption may increase.

SUMMARY

This patent document provides, among others, designs of a data output circuit and an image sensor including an image data output circuit.

Some embodiments of the disclosed technology relate to a data output circuit for reading output data at a high speed by amplifying a voltage of an input stage of a sense amplifier (sense-amp) and an image sensor including such data output circuit.

In an embodiment of the disclosed technology, a data output circuit may include a line memory configured to latch a digital signal, and output the latched digital signal to a pair of column lines in response to an output control signal, a precharge circuit coupled to precharge the pair of column lines with a first precharge voltage level in response to a first precharge signal, a sense amplifier in communication with the line memory to amplify the digital signal on the pair of column lines in response to a sensing enable signal, a charge circuit structured to couple the line memory to the sense amplifier and configured to pass the digital signal to the sense amplifier, and a charge controller configured to charge the charge circuit with a second precharge voltage level in response to a second precharge signal to charge input nodes of the sense amplifier before amplifying the digital signal at the sense amplifier.

In another embodiment of the disclosed technology, an image sensor may include a pixel array including imaging pixel and configured to output a plurality of pixel signals corresponding to incident light, an analog-to-digital converter (ADC) circuit in communication with the pixel array and configured to convert the plurality of pixel signals into at least one digital signal in response to a ramp signal, and a data output circuit configured to latch and amplify the digital signal to output pixel data. The data output circuit may include a line memory configured to latch the digital signal, and output the latched digital signal to a pair of column lines in response to an output control signal, a precharge circuit coupled to the pair of column lines to precharge the pair of column lines with a first precharge voltage level in response to a first precharge signal, a sense amplifier in communication with the line memory to amplify the digital signal on the pair of column lines in response to a sensing enable signal a charge circuit structured to couple the line memory to the sense amplifier and configured to pass the digital signal to the sense amplifier, and, a charge controller configured to charge the charge circuit with a second precharge voltage level in response to a second precharge signal to charge input nodes of the sense amplifier before amplifying the digital signal at the sense amplifier.

In another embodiment of the disclosed technology, a data output circuit may include a line memory configured to latch a digital signal, and output the latched digital signal to a pair of column lines in response to an output control signal, a precharge circuit configured to precharge the pair of column lines with a first precharge voltage level in response to a first precharge signal, a charge circuit configured to charge the pair of column lines with a voltage, a charge controller configured to charge the charge circuit with a second precharge voltage level in response to a second precharge signal, and a sense amplifier configured to amplify an output voltage of the charge circuit in response to a sensing enable signal.

In another embodiment of the disclosed technology, an image sensor may include a pixel array configured to output a plurality of pixel signals corresponding to incident light, an analog-to-digital converter (ADC) circuit configured to convert the plurality of pixel signals into at least one digital signal in response to a ramp signal, and a data output circuit configured to latch and amplify the digital signal, and thus output pixel data. The data output circuit may include a line memory configured to latch the digital signal, and output the latched digital signal to a pair of column lines in response to an output control signal, a precharge circuit configured to precharge the pair of column lines with a first precharge voltage level in response to a first precharge signal, a charge circuit configured to charge the pair of column lines with a voltage, a charge controller configured to charge the charge circuit with a second precharge voltage level in response to a second precharge signal, and a sense amplifier configured to amplify an output voltage of the charge circuit in response to a sensing enable signal.

BRIEF DESCRIPTION OF THE DRAWINGS

The above and other features and advantages of the present disclosure will become readily apparent by reference to the following detailed description when considered in conjunction with the accompanying drawings wherein.

DETAILED DESCRIPTION

Figure 1:
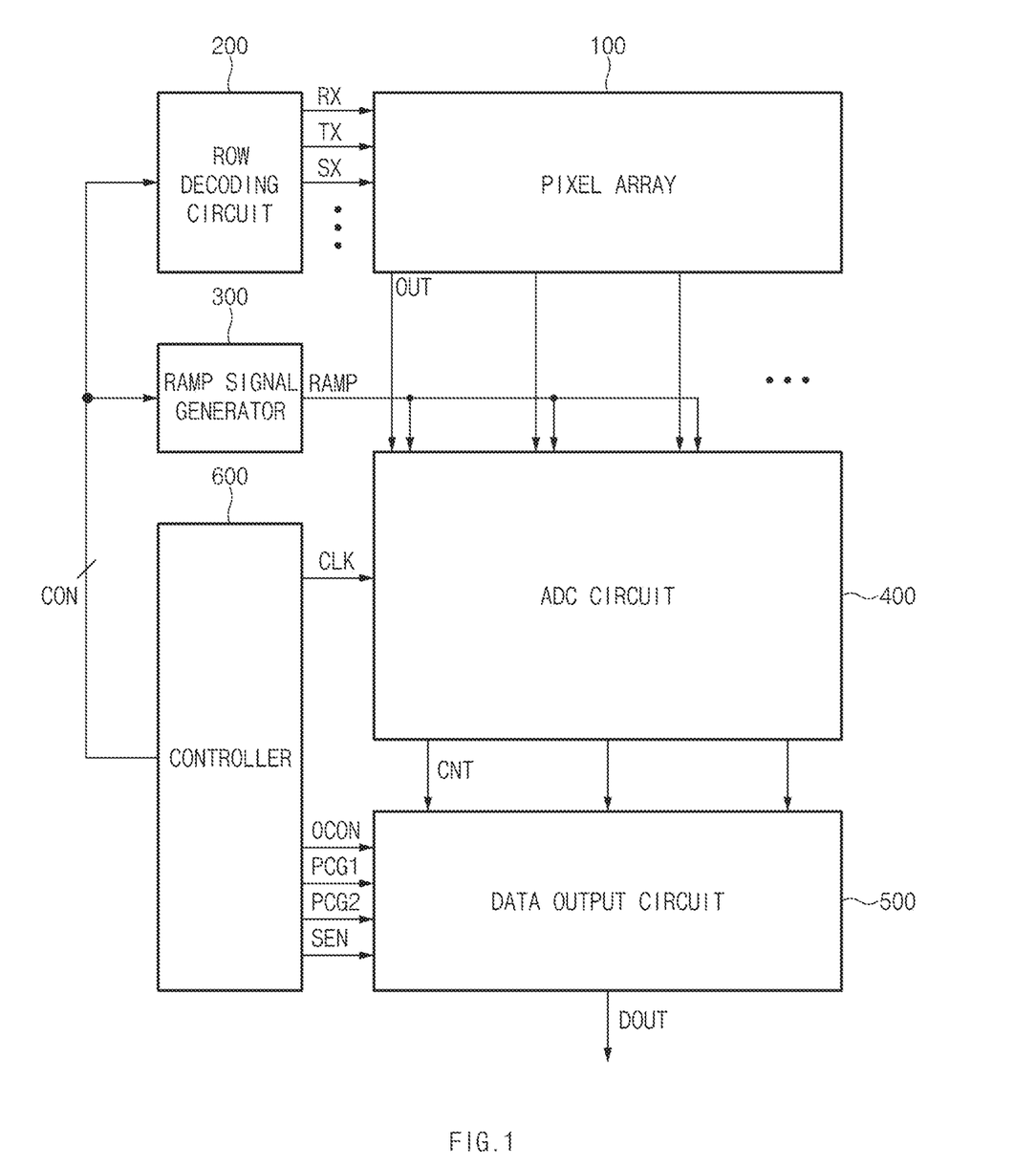
FIG. 1 illustrates an example of an image sensor including a data output circuit based on an embodiment of the disclosed technology.

FIG. 1 is a schematic diagram illustrating an example of an image sensor 10 based on an embodiment of the disclosed technology.

Referring to FIG. 1, the image sensor may include a pixel array 100, a row decoding circuit 200, a ramp signal generator 300, an analog-to-digital converter (ADC) circuit 400, a data output circuit 500, and a controller 600.

The pixel array 100 may include imaging pixels that convert an incident light signal into an electrical signal, and may output an analog pixel signal OUT to the ADC circuit 400. The imaging pixels can be used to convert received incident light onto different imaging pixels into electrical charges or signals to represent images carried in the incident light. The imaging pixels can be semiconductor photosensors formed a substrate such as CMOS sensors. In some embodiments of the disclosed technology, the pixel array 100 may be driven by various drive signals such as a reset signal RX, a transmission signal TX, and a selection signal SX, which are generated by the row decoding circuit 200. In some embodiments of the disclosed technology, the pixel array 100 includes a closely spaced matrix of imaging pixels arranged in rows and columns.

The row decoding circuit 200 may select one or more pixels belonging to each row line of the pixel array 100 based on a control signal CON received from the controller 600 to control operations of the selected pixel.

The ramp signal generator 300 may generate a ramp signal RAMP in response to the control signal CON received from the controller 600, and may output the ramp signal RAMP to the ADC circuit 400.

The ADC circuit 400 may convert an analog pixel signal OUT received from the pixel array 100 into a digital signal. The ADC circuit 400 may compare the pixel signal OUT received from the pixel array 100 with the ramp signal RAMP received from the ramp signal generator 300 to output a result of comparison between the pixel signal OUT and the ramp signal RAMP. The ADC circuit 400 may count the number of clock pulses CLK received from the controller 600 based on the result of comparison between the pixel signal OUT and the ramp signal RAMP, and may output a column-based counting signal CNT.

In some embodiments of the disclosed technology, the ramp signal generator 300 can generates a ramp signal RAMP that, for example, ramps up or down (e.g., saw-tooth signal). The ADC circuit 400 may include a comparator circuit that compares the pixel signal OUT with the ramp signal RAMP, and may also include a counter circuit that counts up with each clock pulse CLK until a certain event occurs (e.g., until a ramping-up signal exceeds the pixel signal, or until the pixel signal exceeds a ramping-down ramp signal) to generate the column-based counting signal CNT for each column.

The data output circuit 500 may latch or hold the digital counting signal CNT received from the ADC circuit 400. In some embodiments of the disclosed technology, the data output circuit 500 may include a memory circuit that stores the count provided by the counter circuit. For example, the data output circuit 500 may include one or more memories that latch or hold the counting signal CNT, and may sequentially output pixel data DOUT based on the counting signal CNT in response to an output control signal OCON. In some embodiments of the disclosed technology, each column may include its own memory circuit. In this case, each column may include its own comparator circuit, counter circuit, and memory circuit.

The data output circuit 500 may read out data from the one or more memories at a high speed by amplifying a voltage of an input stage of a sense amplifier, as will be discussed below. For this purpose, the data output circuit 500 may receive an output control signal OCON, a first precharge signal PCG, a second precharge signal PCG2, and a sensing enable signal SEN from the controller 600.

The controller 600 may control the row decoding circuit 200, the ramp signal generator 300, the ADC circuit 400, and the data output circuit 500. In some embodiments of the disclosed technology, the controller 600 may include a timing generator. For example, the controller 600 may control overall procedure ranging from a process of sensing image data to a process of outputting the sensed image data based on timing information generated by the timing generator.

For this purpose, the controller 600 may generate a control signal CON, and may output the control signal CON to the row decoding circuit 200 and the ramp signal generator 300. The controller 600 may generate a clock signal CLK, and may output the clock signal CLK to the ADC circuit 400. In addition, the controller 600 may generate an output control signal OCON, a first precharge signal PCG, a second precharge signal PCG2, and a sensing enable signal SEN, and may output the output control signal OCON, the first precharge signal PCG, the second precharge signal PCG2, and the sensing enable signal SEN to the data output circuit 500.

Figure 2:
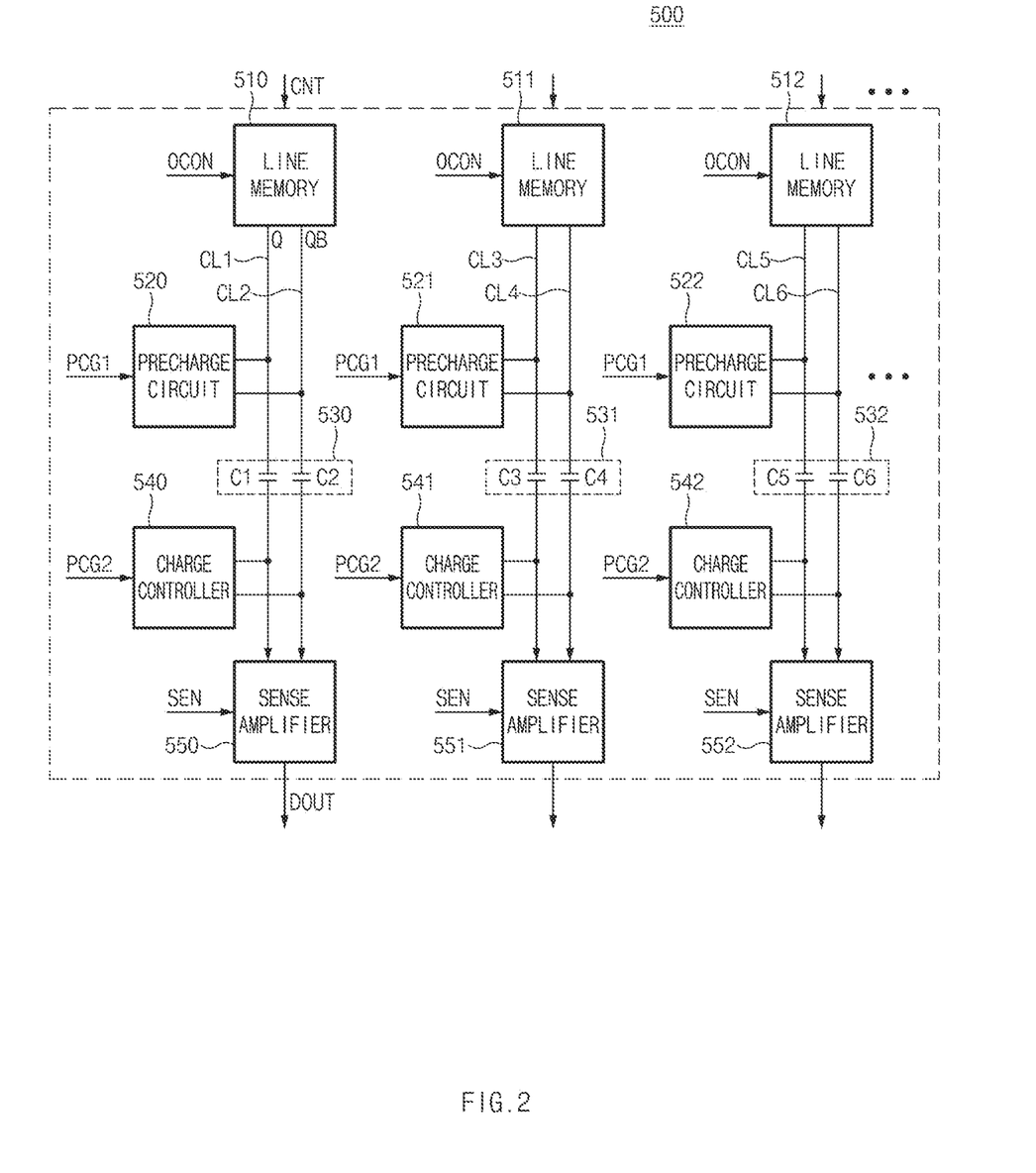
FIG. 2 illustrates an example of the data output circuit shown in FIG. 1.

FIG. 2 is a schematic diagram illustrating an example of the data output circuit 500 shown in FIG. 1.

Referring to FIG. 2, the data output circuit 500 may include a plurality of line memories 510-512, a plurality of precharge circuits 520-522, a plurality of charge circuits 530-532, a plurality of charge controller 540-542, and a plurality of sense amplifiers 550-552.

In some embodiments of the disclosed technology, the plurality of line memories 510-512 may receive digital signals CNT from the ADC circuit 400 to store the digital signal CNT for each column line. The line memory 510 may be coupled to the sense amplifier 550 through column lines CL1 and CL2. The line memory 511 may be coupled to the sense amplifier 551 through column lines CL3 and CL4. The line memory 512 may be coupled to the sense amplifier 552 through column lines CL5 and CL6. The line memory 510 may output a pair of data signals Q and QB to two column lines CL1 and CL2. The line memory 511 may output a pair of data signals Q and QB to two column lines CL3 and CL4. The line memory 512 may output a pair of data signals Q and QB to two column lines CL5 and CL6.

By the way of example and not by limitation, each of the line memories 510-512 can be implemented as a static random access memory (SRAM). The line memory 510 may output a pair of data signals Q and QB for each column to column lines CL1 and CL2 in response to the output control signal OCON. The line memory 511 may output a pair of data signals Q and QB for each column to column lines CL3 and CL4 in response to the output control signal OCON. The line memory 512 may output a pair of data signals Q and QB for each column to column lines CL5 and CL6 in response to the output control signal OCON.

In an embodiment, a pair of data signals Q and QB output from each of the line memories 510-512 are complementary signals. The pair of data signals Q and QB will hereinafter referred to as a data pair Q and QB for convenience of description.

Each of the line memories 510-512 may charge or discharge a pair of column lines (e.g., a pair of column lines CL1 and CL2) based on the pair of data signals Q and QB in response to the output control signal OCON.

For example, the charge stored in the line memory 510 may be shared between the line memory 510 and one of two column lines CL1 and CL2. For example, where two column lines CL1 and CL2 are precharged and one of the column lines CL1 and CL2 is discharged and the other one of the column lines CL1 and CL2 remains charged, a voltage difference between the two column lines CL1 and CL2 can indicate the data stored in the line memory 510 coupled to the column lines CL1 and CL2. As another example, where two column lines CL1 and CL2 are precharged at a certain low voltage and one of the column lines CL1 and CL2 is charged to a high voltage and the other one of the column lines CL1 and CL2 remains low, a voltage difference between the two column lines CL1 and CL2 can indicate the data stored in the line memory 510 coupled to the column lines CL1 and CL2. In this way, the plurality of line memories 510-512 may transmit the voltage difference to a differential input terminal of each of the sense amplifiers 550-552, which can generate output values indicative of the voltage differences between column lines CL1 and CL2, column lines CL3 and CL4, column lines CL5 and CL6.

The plurality of precharge circuits 520-522 may precharge each of the column lines CL1-CL6 with a first precharge voltage level in response to the first precharge signal PCG1. For example, the precharge circuit 520 may precharge column lines CL1 and CL2 before the charge sharing between the line memory 510 and the column lines CL1 and CL2, and, after the charge sharing, the pair of data signals Q and QB on the column lines CL1 and CL2 is transmitted to the sense amplifier 550. The precharge circuit 521 may precharge column lines CL3 and CL4 before the charge sharing between the line memory 511 and the column lines CL3 and CL4, and, after the charge sharing, the pair of data signals Q and QB on the column lines CL3 and CL4 is transmitted to the sense amplifier 551. The precharge circuit 522 may precharge column lines CL5 and CL6 before the charge sharing between the line memory 512 and the column lines CL5 and CL6, and, after the charge sharing, the pair of data signals Q and QB on the column lines CL5 and CL6 is transmitted to the sense amplifier 552. That is, the plurality of precharge circuits 520-522 may precharge the column lines CL1-CL6 before charge sharing between the memories and the column lines, and then the pairs of data signals Q and QB on the column lines are transmitted to the sense amplifiers 550-552. In an embodiment, the first precharge voltage level applied to each of the column lines CL1-CL6 may be set to "VDD/2" (where VDD is a power-supply voltage).

By the way of example and not by limitation, the number of the precharge circuits 520-522 may be identical to the number of line memories 510-512. In various embodiments of the disclosed technology, the number of the precharge circuits 520-522 and the positions of the precharge circuits 520-522 may vary. Each of the plurality of precharge circuits 520-522 may include a plurality of switching elements (not shown), each of which is driven in response to the first precharge signal PCG1.

The charge circuit 530 may charge input nodes of the sense amplifier 550 using a second precharge voltage received from the charge controller 540. The charge circuit 530 may pass the pairs of data signals Q and QB from one electrode to the other electrode thereof, and the second precharge voltage is used to charge the other electrode of the charge circuit 530, feeding the pairs of data signals Q and QB amplified with the second precharge voltage to the sense amplifier 550. The charge circuit 531 may charge input nodes of the sense amplifier 551 using a second precharge voltage received from the charge controller 541. The charge circuit 531 may pass the pairs of data signals Q and QB from one electrode to the other electrode thereof, and the second precharge voltage is used to charge the other electrode of the charge circuit 531, feeding the pairs of data signals Q and QB amplified with the second precharge voltage to the sense amplifier 551. The charge circuit 532 may charge input nodes of the sense amplifier 552 using a second precharge voltage received from the charge controller 542. The charge circuit 532 may pass the pairs of data signals Q and QB from one electrode to the other electrode thereof, and the second precharge voltage is used to charge the other electrode of the charge circuit 531, feeding the pairs of data signals Q and QB amplified with the second precharge voltage to the sense amplifier 552.

In some embodiments of the disclosed technology, the charge circuit 530 may include capacitors C1 and C2 configured to store electric charges obtained from the pair of column lines CL1 and CL2. The capacitor C1 may be coupled between the column line CL1 and the sense amplifier 550. The capacitor C2 may be coupled between the column line CL2 and the sense amplifier 550. The capacitors C1 and C2 may block direct current and allow alternating current to flow between the line memory 510 and the sense amplifier 550.

The charge circuit 531 may include capacitors C3 and C4 configured to charge electric charges obtained from the pair of the column lines CL3 and CL4. The capacitor C3 may be coupled between the column line CL3 and the sense amplifier 551. The capacitor C4 may be coupled between the column line CL4 and the sense amplifier 551. The capacitors C3 and C4 may block direct current and allow alternating current to flow between the line memory 511 and the sense amplifier 551.

The charge circuit 532 may include capacitors C5 and C6 configured to charge electric charges obtained from the pair of the column lines CL5 and CL6. The capacitor C5 may be coupled between the column line CL5 and the sense amplifier 552. The capacitor C6 may be coupled between the column line CL6 and the sense amplifier 552. The capacitors C5 and C6 may block direct current and allow alternating current to flow between the line memory 512 and the sense amplifier 552.

The charge controller 540 may precharge the charge circuit 530 with the second precharge voltage level in response to the second precharge signal PCG2. The charge controller 541 may precharge the charge circuit 531 with the second precharge voltage level in response to the second precharge signal PCG2. The charge controller 542 may precharge the charge circuit 532 with the second precharge voltage level in response to the second precharge signal PCG2. In an embodiment, the second precharge voltage level provided to each of the charge circuits 530-532 may be set to a power-supply voltage (VDD) level. In another embodiment, the second precharge voltage level provided to each of the charge circuits 530-532 may be set to a ground voltage (VSS) level.

In yet another embodiment, in a precharge period, the first precharge signal PCG1 may be activated at the same timing as the second precharge signal PCG2. In yet another embodiment, the first precharge signal PCG1 and the second precharge signal PCG2 may be activated earlier than the output control signal OCON and the sensing enable signal SEN.

By the way of example and not by limitation, the number of the charge controllers 540-542 may be identical to the number of line memories 510-512. In various embodiments of the disclosed technology, the number of the charge controllers 540-542 and positions of the charge controllers 540-542 may vary.

In some embodiments of the disclosed technology, each of the plurality of charge controllers 540-542 may include a plurality of switching elements (not shown), each of which is driven in response to the second precharge signal PCG2.

Each of the sense amplifiers 550-552 may perform a sensing operation in response to a sensing enable signal SEN. The sense amplifier 550 may detect a voltage difference between column lines CL1 and CL2 and amplify the detected voltage difference to output pixel data DOUT. The sense amplifier 551 may detect a voltage difference between column lines CL3 and CL4 and amplify the detected voltage difference to output pixel data DOUT. The sense amplifier 552 may detect a voltage difference between column lines CL5 and CL6 and amplify the detected voltage difference to output pixel data DOUT.

Operations of the data output circuit 500 having the above-mentioned constituent elements are as follows. Since data readout operations of individual columns are identical to each other as shown in FIG. 2, the data readout operation of only one column from among the plurality of columns will hereinafter be described for convenience of description.

The precharge circuit 520 may precharge the pair of column lines CL1 and CL2 with the first precharge voltage level (e.g., VDD/2) in response to the first precharge signal PCG1. The charge controller 540 may precharge the pair of column lines CL1 and CL2 with the second precharge voltage level in response to the second precharge signal PCG2.

Therefore, the second precharge voltage (e.g., power-supply voltage VDD) may be applied to each of capacitors C1 and C2, such that each of the capacitor C1 and C2 may be charged with the second precharge voltage (e.g., VDD). As a result, a voltage applied to an input terminal of the sense amplifier 550 may be amplified in response to the voltage level charged in each of the capacitors C1 and C2.

Subsequently, the line memory 510 may latch or hold the digital signal CNT received from the ADC circuit 400. The line memory 510 may transmit the pair of data signals Q and QB to the pair of column lines CL1 and CL2 in response to the output control signal OCON.

A voltage level of the pair of data signals Q and QB respectively applied to the column lines CL1 and CL2 may be amplified by the capacitors C1 and C2, and the resultant voltage amplified by the capacitors C1 and C2 may be transmitted to the input terminal of the sense amplifier 550.

Subsequently, when the sensing enable signal SEN is activated, the sense amplifier 550 may detect and amplify a voltage difference between two complementary data signals Q and QB to output pixel data DOUT. The data output circuit 500 implemented based on some embodiments of the disclosed technology may increase an operation speed of the sense amplifier 550 by amplifying a voltage difference between two column lines CL1 and CL2 coupled to the sense amplifier 550.

Figure 3:
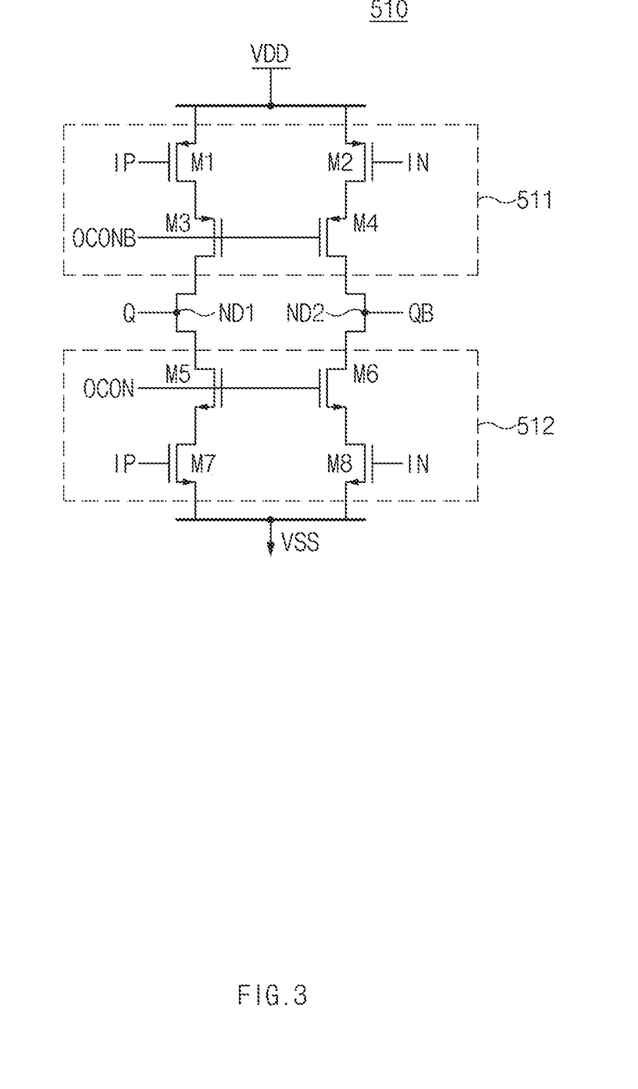
FIG. 3 illustrates an example of line memories shown in FIG. 2.

FIG. 3 is a circuit diagram illustrating an example of the line memories 510-512 shown in FIG. 2. For convenience of description, the following embodiment of FIG. 3 will hereinafter be described using only one line memory 510 from among the line memories 510-512 as an example.

The line memory 510 may include a charge circuit 511 and a discharge circuit 512. In this case, the charge circuit 511 may allow each of an output node ND1 of the data signal Q and an output node ND2 of the other data signal QB to be charged with the power-supply voltage (VDD) level in response to an output control signal OCONB. The discharge circuit 512 may allow each of the output node ND1 of the data Q and the output node ND2 of the other data QB to be discharged with a ground voltage (VSS) level in response to the output control signal OCON.

The charge circuit 511 may include a plurality of switching elements M1-M4. In an embodiment of the disclosed technology, each of the switching elements can be implemented as a P-channel metal oxide semiconductor (PMOS) transistor. In another embodiment of the disclosed technology, each of the switching elements can be implemented as a N-channel metal oxide semiconductor (NMOS) transistor, or a combination of PMOS and NMOS transistors.

The switching elements M1 and M2 may be coupled in parallel to the power-supply voltage (VDD) input terminal. The switching element M1 may be coupled between the power-supply voltage (VDD) input terminal and the switching element M3, such that the switching element M1 may receive an input signal IP through a gate terminal thereof. The switching element M2 may be coupled between the power-supply voltage (VDD) input terminal and the switching element M4, such that the switching element M2 may receive an input signal IN through a gate terminal thereof.

In this case, the input signal IP or IN may correspond to the digital signal CNT that is output from the ADC circuit 400. For example, when the digital signal CNT is at a logic high level, the input signal IP may be activated. When the digital signal CNT is at a logic low level, the input signal IN may be activated. The input signal IN may be opposite in logic level to the other input signal IP.

The switching element M3 may be coupled between the switching element M1 and the output node ND1, such that the switching element M3 may receive the output control signal OCONB through a gate terminal thereof. In this case, the output control signal OCONB may be an inversion signal of the other output control signal OCON. The switching element M4 may be coupled between the switching element M2 and the output node ND2, such that the switching element M4 may receive the output control signal OCONB through a gate terminal thereof.

The discharge circuit 512 may include a plurality of switching elements M5-M8. In an embodiment, each of the switching elements M5-M8 can be implemented as an NMOS. In another embodiment of the disclosed technology, each of the switching elements can be implemented as a PMOS, or a combination of PMOS and NMOS transistors.

The switching element M5 may be coupled between the node ND1 and the switching element M7, such that the switching element M5 may receive the output control signal OCON through a gate terminal thereof. The switching element M6 may be coupled between the output node ND2 and the switching element M8, such that the switching element M6 may receive the output control signal OCONB through a gate terminal thereof.

The switching elements M7 and M8 may be coupled in parallel to the ground voltage (VSS) input terminal. The switching element M7 may be coupled between the switching element M5 and the ground voltage (VSS) input terminal, such that the switching element M7 may receive the input signal IP through a gate terminal thereof. The switching element M8 may be coupled between the switching element M6 and the ground voltage (VSS) input terminal, such that the switching element M8 may receive the input signal IN through a gate terminal thereof.

Operations of the line memory 510 having the above-mentioned constituent elements are as follows. For convenience of description, the following embodiment will hereinafter be described using only one line memory 510 from among the line memories 510-512 as an example.

Referring to FIG. 3, when the output control signal OCON is enabled to a high level, the output control signal OCONB may be disabled to a low level, such that all the switching elements M3-M6 may be turned on.

In this case, when the input signal IP is at a high level, the input signal IN may transition to a low level. As a result, the switching element M2 of the charge circuit 511 and the switching element M7 of the discharge circuit 512 may be turned on. Therefore, the output node ND2 of the data QB may transition from the first precharge voltage level to the power-supply voltage (VDD) level, such that the output node ND2 of the data QB may be charged with the power-supply voltage (VDD) level. In addition, the output node ND1 of the data Q may transition from the first precharge voltage level to the ground voltage (VSS) level, such that the output node ND1 of the data Q may be discharged to the ground voltage (VSS) level.

In contrast, when the input signal IP is at a low level, the input signal IN may transition to a high level. Therefore, the switching element M1 of the charge circuit 511 and the switching element M6 of the discharge circuit 512 may be turned on.

As a result, the output node ND1 of the data Q may transition from the first precharge voltage level to the power-supply voltage (VDD) level, such that the output node ND1 of the data Q may be charged with the power-supply voltage (VDD) level. In addition, the output node ND2 of the data QB may transition from the first precharge voltage level to the ground voltage (VSS) level, such that the output node ND2 of the data QB may be discharged to the ground voltage (VSS) level.

As described above, when the output control signal OCON is activated, the line memory 510 may allow each of the output node ND1 of the data Q and the output node ND2 of the data QB to be charged or discharged in response to a logic level of the input signal IP or IN. That is, one column line from among two column lines CL1 and CL2 respectively coupled to the output nodes ND1 and ND2 may increase a voltage through the charging operation, and the other column line from among the two column lines CL1 and CL2 respectively coupled to the output nodes ND1 and ND2 may reduce a voltage through the discharging operation.

For example, when the input signal IP is activated, the column line CL2 coupled to the output node ND2 may be charged, and the column line CL1 coupled to the output node ND1 may be discharged. In contrast, when the input signal IN is activated, a voltage of the column line CL2 coupled to the output node ND2 may be discharged, and a voltage of the column line CL1 coupled to the node ND1 may be charged.

Therefore, the data output circuit and the image sensor including such data output circuit implemented based on some embodiments of the disclosed technology may control voltages of two column lines CL1 and CL2 among which the charge stored in the line memory 510 is shared such that the column lines CL1 and CL2 are charged or discharged in a complementary manner. As a result, the data output circuit and the image sensor including such data output circuit implemented based on some embodiments of the disclosed technology may maintain input terminals of the sense amplifier 550 at the central voltage level and prevent differential input values from leaning to one level. In this way, the differential input values of the sense amplifier 550 can be amplified without error.

As is apparent from the above description, the data output circuit and the image sensor including such data output circuit implemented based on some embodiments of the disclosed technology can read out data at a high speed.

Only a few implementations and examples are described and other implementations, enhancements and variations can be made based on what is described and illustrated in this patent document.

What is claimed is:

1. A data output circuit comprising:
   a line memory configured to latch a digital signal and output the latched digital signal to a pair of column lines in response to an output control signal;
   a precharge circuit coupled to the pair of column lines to precharge the pair of column lines with a first precharge voltage level in response to a first precharge signal;
   a sense amplifier in communication with the line memory to amplify the digital signal on the pair of column lines in response to a sensing enable signal;
   a charge circuit structured to couple the line memory to the sense amplifier and configured to pass the digital signal to the sense amplifier; and
   a charge controller configured to charge the charge circuit with a second precharge voltage level in response to a second precharge signal to charge input nodes of the sense amplifier before amplifying the digital signal at the sense amplifier.

2. The data output circuit according to claim 1, wherein the first precharge voltage level is a half a power-supply voltage level.

3. The data output circuit according to claim 1, wherein the second precharge voltage level is a power-supply voltage level.

4. The data output circuit according to claim 1, wherein the second precharge voltage level is a ground voltage level.

5. The data output circuit according to claim 1, wherein the first precharge signal is activated at the same timing as the second precharge signal.

6. The data output circuit according to claim 1, wherein the first precharge signal and the second precharge signal are activated earlier than the output control signal and the sensing enable signal.

7. The data output circuit according to claim 1, wherein the charge circuit includes a pair of capacitors coupled to the pair of column lines.

8. The data output circuit according to claim 1, wherein the line memory is configured to control the pair of column lines to be charged or discharged in a complementary manner in response to a logic level of the digital signal, when the output control signal is activated.

9. The data output circuit according to claim 1, wherein the line memory includes:
   a charge circuit configured to charge the pair of column lines in response to a logic level of the digital signal, when the output control signal is activated; and
   a discharge circuit configured to discharge the pair of column lines in response to a logic level of the digital signal, when the output control signal is activated.

10. The data output circuit according to claim 9, wherein the charge circuit includes:
    a first switching element configured to charge a first column line from among the column lines with a power-supply voltage level in response to a first input signal; and
    a second switching element configured to charge a second column line from among the column lines with the power-supply voltage level in response to a second input signal corresponding to an inversion signal of the first input signal.

11. The data output circuit according to claim 10, wherein the charge circuit includes:
    a pair of switching elements configured to couple the pair of column lines to the charge circuit in response to an inversion signal of the output control signal.

12. The data output circuit according to claim 9, wherein the discharge circuit includes:
    a third switching element configured to discharge a first column line from among the column lines with a ground voltage level; and
    a fourth switching element configured to discharge a second column line from among the column lines with the ground voltage level in response to a second input signal corresponding to an inversion signal of the first input signal.

13. The data output circuit according to claim 12, wherein the discharge circuit includes:
    a pair of switching elements configured to couple the pair of column lines to the discharge circuit in response to the output control signal.

14. An image sensor comprising:
    a pixel array including imaging pixels and configured to output a plurality of pixel signals corresponding to incident light;
    an analog-to-digital converter (ADC) circuit in communication with the pixel array and configured to convert the plurality of pixel signals into at least one digital signal in response to a ramp signal; and
    a data output circuit configured to latch and amplify the digital signal to output pixel data,
    wherein the data output circuit includes:
       a line memory configured to latch the digital signal, and output the latched digital signal to a pair of column lines in response to an output control signal;
       a precharge circuit coupled to the pair of column lines to precharge the pair of column lines with a first precharge voltage level in response to a first precharge signal;
       a sense amplifier in communication with the line memory to amplify the digital signal on the pair of column lines in response to a sensing enable signal;
       a charge circuit structured to couple the line memory to the sense amplifier and configured to pass the digital signal to the sense amplifier;
       a charge controller configured to charge the charge circuit with a second precharge voltage level in response to a second precharge signal to charge input nodes of the sense amplifier before amplifying the digital signal at the sense amplifier.

15. The image sensor according to claim 14, wherein the first precharge voltage level is a half a power-supply voltage level.

16. The image sensor according to claim 14, wherein the second precharge voltage level is a power-supply voltage level.

17. The images sensor according to claim 14, wherein the second precharge voltage level is a ground voltage level.

18. The image sensor according to claim 14, wherein the first precharge signal is activated at the same time point as the second precharge signal.

19. The image sensor according to claim 14, wherein the first precharge signal and the second precharge signal are activated earlier than the output control signal and the sensing enable signal.

20. The image sensor according to claim 14, wherein the line memory is configured to control the pair of column lines to be charged or discharged in a complementary manner in response to a logic level of the digital signal, when the output control signal is activated.

* * * * *